United States Patent [19]
Davis et al.

[11] Patent Number: 5,929,708
[45] Date of Patent: Jul. 27, 1999

[54] LOW-VOLTAGE RADIO FREQUENCY AMPLIFIER

[75] Inventors: Paul Cooper Davis; Milton Luther Embree, both of Muhlenberg Township; Brian K. Horton, Sinking Springs, all of Pa.

[73] Assignee: Lucent Technologies Inc., Murray Hill, N.J.

[21] Appl. No.: 08/974,818

[22] Filed: Nov. 20, 1997

Related U.S. Application Data

[60] Provisional application No. 60/046,139, May 9, 1997.
[51] Int. Cl.$^6$ ....................................................... H03F 3/04
[52] U.S. Cl. ........................................... 330/288; 330/301
[58] Field of Search ................................... 330/275, 288, 330/301, 311; 327/359, 356; 455/333

[56] References Cited

U.S. PATENT DOCUMENTS

| | | | |
|---|---|---|---|
| 4,485,352 | 11/1984 | Davies et al. | 330/288 |
| 5,337,010 | 8/1994 | Nishiyama | 330/311 X |

*Primary Examiner*—Steven J. Mottola

[57] ABSTRACT

A power-conserving, linear and broad band RF amplifier, suitable for use at more than one band in the ultra-high frequency regions allotted to radiotelephone transceivers, employs an emitter-follower output transistor to deliver the nominal 1.0 milliwatt RF power to a single-ended load from a low voltage battery, typically 2.7 v. dc, without the use of output coupling transformers. The amplifier receives only a small differential input signal from the preceding mixer or multiplier stage having a typical peak-to-peak magnitude of 0.3 v. The differential input signal is applied to the emitters of a pair of transistors whose bases are interconnected, one transistor of which (B6) is diode-connected in a current-mirror configuration and the other (B5) of which is configured in a common-base connection with emitter degeneration. The signals are summed at the collector of the common-base transistor to deliver a substantial voltage swing, illustratively 1.7 volts peak to peak, which is large enough to drive the base of the emitter-follower output transistor (B3) without requiring the high standby current in the emitter-follower normally required to maintain an emitterfollower in Class A operation.

17 Claims, 2 Drawing Sheets

LOW-VOLTAGE RADIO FREQUENCY AMPLIFIER

This application claims the benefit of U.S. Provisional Application No. 60/046139 filed May 9, 1997.

FIELD OF THE INVENTION

This invention relates to radio frequency (RF) amplifiers and, more particularly, to RF amplifiers for use with limited battery supply voltage, such as employed in hand-held radiotelephone transceivers.

BACKGROUND OF THE INVENTION

Hand-held radiotelephone transceivers are currently available for operation in either the 900 MHZ or 1.8 gHz bands. Since the size and weight of a hand-held unit must be kept to a minimum, it is desirable to employ as small and low voltage a battery as possible, typically 2.7 volts, and to employ circuits which reduce the battery current drain in order to maximize useful operating time. Such transceivers, however, also use a form of vector or phase modulation which requires that the RF amplifier stage preceding the final power amplifier be operated in class A linear mode to prevent phase shift error. Such a stage typically employs an emitter-follower at its output which must supply 1 milliwatt drive power into the low impedance (usually 50 ohms) presented by the single-ended filter leading to the final power amplifier. To maintain the RF amplifier stage in its linear, class A region, where the peak-to-peak excursion of the driving voltage cannot be permitted to clip the signal, it has heretofore been necessary to make sure that the transistors of the emitter-follower output neither saturate nor cut off. Accomplishing these goals has heretofore required that these transistors draw a large dc standby current equal, theoretically, to at least half the peak-to-peak output current. In practical applications the value of standby current is much larger.

Also, because of the use of a low voltage battery, the RF amplifier stage is in the amount of voltage swing that can be delivered to the base of the emitter-follower output transistor, typically not more than about 300 millivolts peak-to-peak. Since the load to be driven is single-ended, a coupling arrangement such as an air core RF transformer or a phase shifting circuit is required to convert the differential output to a single ended output. Unfortunately, both types of coupling arrangements tend to operate best in only one frequency band. It is thus very difficult to have the same RF amplifier circuit work at both the 900 MHZ and 1.8 or 1.9 gHz bands.

It would be extremely advantageous to provide an RF amplifier capable of delivering the required output power to a single ended load without requiring the use of transformers, without requiring the use of a large standby current to maintain amplifier linearity and which operates efficiently at more than one RF band so that a hand-held radiotelephone receiver could in fact be operated at more than one, such as both the 900 MHZ and 1.8 or 1.9 gHz bands.

SUMMARY OF THE INVENTION

The foregoing and other features of the present invention are achieved in the illustrative embodiment of an RF amplifier suitable for use in a hand-held radiotelephone transceiver powered by a low voltage battery and in which the collector swing of its input signal from the previous mixer or multiplier stage is limited to a small fraction of the battery voltage. The limited swing, differential signal from the preceding stage is applied to the emitters of a pair of input transistors whose bases are coupled together. The first of the input transistors is diode-connected in series with a first constant current source which provides the bias to both input transistors. The second input transistor has its collector coupled to the base of an emitter-follower output transistor whose emitter is connected to a second constant current source. The differential voltages applied to the emitters of the two input transistors produce a large difference voltage at the base of the emitter-follower output transistor. The emitter of the emitter-follower output transistor provides a single-ended output capable of delivering the required power to a load without the need for a coupling transformer and having sufficient power to drive the load in Class A without requiring excessive standby current.

DESCRIPTION OF THE DRAWING

The foregoing and other features of the present invention may become more apparent when the ensuing description is read together with the drawing in which.

GENERAL DESCRIPTION

Figure 1:
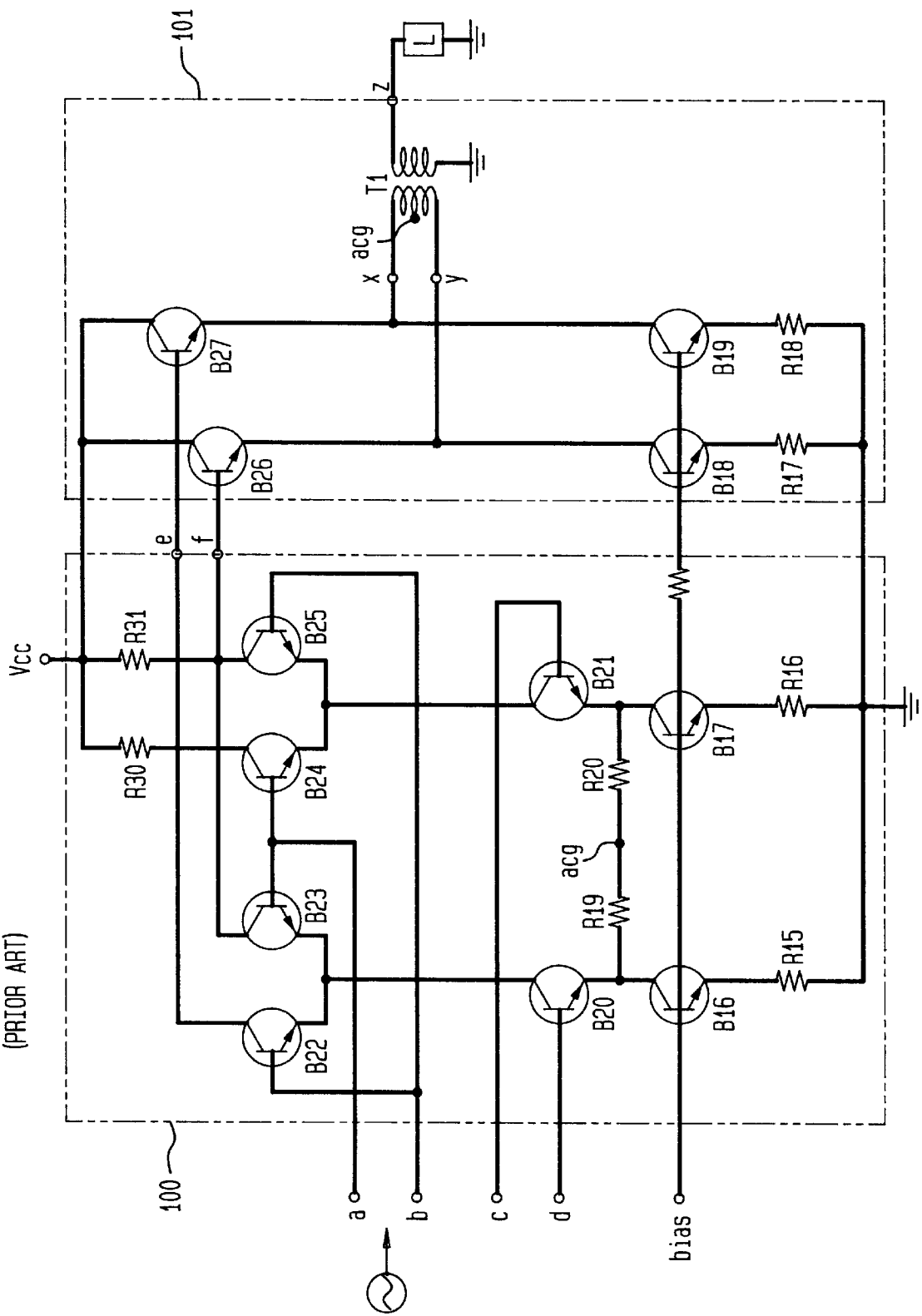
FIG. 1 is a simplified schematic diagram of a prior art mixer or multiplier stage followed by an RF amplifier stage having a pair of emitter-followers for driving a low impedance load through an RF transformer.

FIG. 1 shows a prior art circuit of the type employed in a hand-held radiotelephone transceiver for operation at either 900 MHZ or 1.8 gHz employing a low voltage battery supply Vcc, typically 2.7 volts. At the left the rectangle 100 encloses an RF mixer or analog multiplier stage and the rectangle 101 at the right encloses a pair of emitter-followers that provides a differential output to a low impedance load L through a coupling transformer T1. The circuit may be used, for example, at 900 MHZ with transformer T1 properly tuned for operation at that frequency or, with a different transformer T1, it may be used at the higher 1.9 gHz band since the same transformer cannot be used in both bands without serious loss of efficiency.

When configured for use as a mixer, a modulated intermediate frequency signal is presented to terminals c, d and a local oscillator signal is applied at terminals a, b to provide an RF output at terminals e, f at the right. When configured for use as a multiplier, an RF signal is applied at terminals c, d and a control voltage is applied at terminals a, b to provide an amplitude modulated RF signal at output terminals e, f. The circuit comprising transistors B22, B23, B24, B25 and including transistors B16, B17, B20 and B21 and resistors R19, R20, R30 and R31 have become known as a "Gilbert" mixer or multiplier which is described in B. Gilbert, "A Precise Four-Quadrant Multiplier with Subnanosecond Response", IEEE Journal of Solid-State Circuits, Vol. SC-3, pp. 365–373, December, 1968.

The circuit at the left-hand side of FIG. 1 is substantially a Gilbert mixer circuit. Briefly, transistors B16 and B17 are current sources having their bases connected to the bias rail that provides a voltage reference establishing the emitter currents for transistors B20 and B21, respectively. Transistors B20 and B21 are in series with or "stacked" atop transistors B16, B17 are an emitter-coupled pair. Resistors R19 and R20 connect the emitters of transistors B20 and B21 to provide linearizing degeneration to overcome the variation in small signal emitter resistance with emitter current (illustratively, 26 mv/$I_e$) of transistors B20, B21. The values of resistors R19, R20 are chosen to be approximately ten times the value of the small signal emitter resistance.

Because the emitters of transistors B20, B21 are connected to constant current sources, the ac collector current of either transistor B20 or B21 is equal to the differential ac input voltage applied at terminals c, d to their bases, divided by the total series resistance of resistors R19 and R20. The signal applied at terminals c, d modulates the amplitude of the current available to flow through transistors B22 through B25 which are "tacked" above transistors B20, B21. When, for example, the ac signal applied at terminal d is positive-going with respect to terminal c, transistor B20 tends to carry more current and transistor B21 less current. Since the current through transistor B16 cannot increase, a path is provided for the extra current from transistor B20 by interconnected resistors R19 and R20 so the current through transistor B17 may remain constant. The center point acg between resistors R 19 and R20 is effectively at ac ground potential.

The modulated current from transistor B20 is applied to the junction of the emitters of transistors B22 and B23 while the modulated current from transistor B21 is applied to the junction of the emitters of transistors B24 and B25. Signals applied at terminals a, b steer the modulated current from transistor B20 either to the "outboard" pair of transistors B22 and B25 or to the inboard pair of transistors B23 and B24 to produce differential voltage drops across resistors R30 and R31. When the input signal applied at terminal b is relatively positive with respect to terminal a, the collector current of transistor B20 tends to be steered through transistor B22 and collector resistor R30 while the collector current of transistor B21 tends to be steered through transistor B25 and collector resistor R31. Likewise, with opposite polarity signals at terminals a, b, the collector current of transistor B20 tends to be steered through transistor B23 and collector resistor R31 while the collector current of transistor B21 tends to be steered through transistor B24 and collector resistor R30. Accordingly the voltage drops across resistors R30 and R31 produce signals at terminals e, f that are four quadrant differential "products" or "mixes" of the signals at terminals a,b and c,d. These differential (ac) signals drive the emitter-follower output transistors B26 and B27 which apply their differential (ac) output currents to the left-hand winding of transformer T1, the center point of which, acg, is at an effective ac ground.

The circuit of FIG. 1 illustrates the "headroom" problem encountered with low voltage battery sources arising from the finite collector-emitter drops of series-connected transistors. With a series stack of three transistors, e.g., B16, B20 and B22, each of which has a base to emitter voltage drop, $V_{be}$, of 0.9 volts, there is very little room for signal swing at the collector of transistor B22 and in practice the peak-to-peak value of this voltage swing is limited to about 300 to 325 millivolts. That is the maximum output voltage drive that the mixer 100 can make available at terminals e, f to the bases of emitter-follower transistors B26 and B27.

As mentioned above, it is a usual requirement that the RF amplifier be able to deliver 1 milliwatt of ac output power to a single-ended 50 ohm load at terminal x or y, which equates to a 600 millivolt peak-to-peak swing. However with a voltage swing of only 325 millivolts peak-to-peak at terminal e or f, there is not enough voltage swing to produce 1 milliwatt in a 50 ohm load at terminal x or y to ground:

$$P = \frac{E^2}{R}$$
$$= \frac{(.7071 \times .162)^2}{50} = 0.0002 \text{ watts.}$$

To provide 1 milliwatt ac output power from either terminal x or y, the prior art circuit of FIG. 1 required that the current be doubled to 12 milliamperes (ma) by reducing the load resistance to 25 ohms or less. Accordingly, the 325 millivolt signal at terminals e, f is applied to a pair of emitter-follower transistors B26 and B27. Transistors B18, B19 and resistors R17 and R18 provide a constant current source to the emitters of transistors B26, B27. To maintain transistors B26 and B27 in class A mode each must carry a quiescent, dc standby current that is at least 12 ma in order not to be cut off on the negative half cycle of the ac drive signal. Actually, best linearity is obtained when the standby current is of the order of 15 ma dc in each of transistor B26 and B27 or a total of 30 ma dc even when no signal is present. This represents a large current drain on the battery supply. Moreover, since the load L is single ended, the differential signals at the emitters of transistors B26, B27 must be applied to a transformer, such as transformer T1, whose input winding receives the differential signals from transistors B26, B27 and whose single output winding drives the load. As mentioned above, RF transformers tend to be efficient couplers at only a narrow band of frequencies and it would be impractical to use the circuit of FIG. 1 for a multiband transceiver such as one that could operate at either 900 MHZ, 1.8 gHz or 1.9 gHz.

Figure 2:
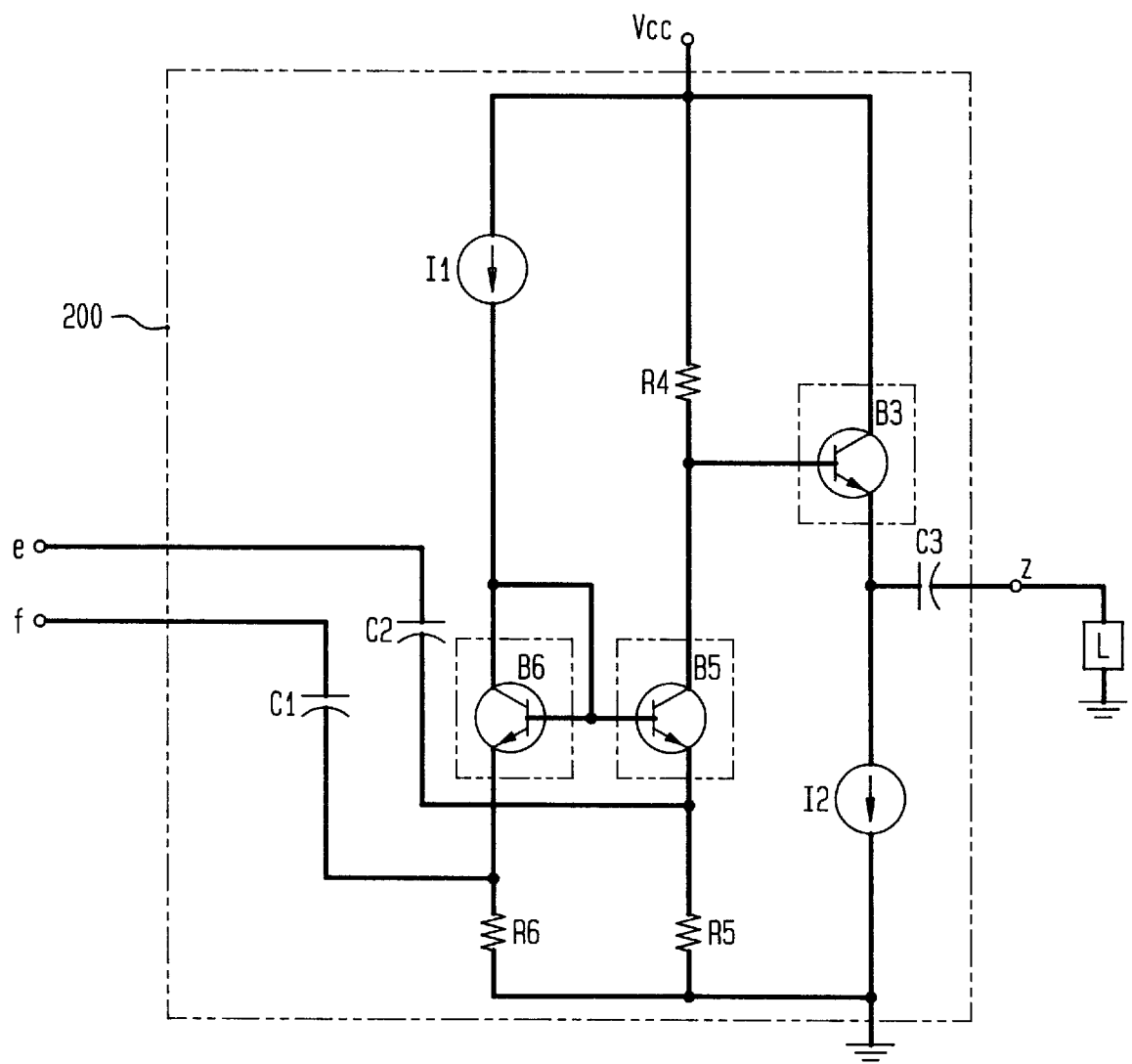
FIG. 2 is a simplified schematic diagram of a portion of a transceiver showing an RF amplifier stage in accordance with an illustrative embodiment of the invention which employs only a single emitter-follower output and requires no RF transformer.

The problem is solved by circuitry 200 of FIG. 2 whose terminals e, f are intended to be coupled to the correspondingly designated terminals e, f of the Gilbert mixer of FIG. 1, replacing the prior art circuit 101. It should be understood that the circuits of both FIG. 1 and 2 may be fabricated using any known VLSI technology. To illustrate this in FIG. 2, the bipolar transistor symbols have been enclosed in rectangular boxes to indicate that within each box either a bipolar or a unipolar semiconductor device can be employed. The limited swing, differential-input signal at terminals e, f from the preceding stage is applied via capacitors C1 and C2 to the emitters of a pair of input transistors B5, B6 whose bases are coupled together in a common-base configuration. Input transistor B6 has its base and collector connected together to operate as a diode in circuit with a first constant current source I1. The dc current through diode-connected transistor B6 establishes the dc current through transistor B5 in a current-mirror configuration, e.g., where resistors R6 and R5 and transistors B6 and B5 are identical, transistors B6 and B5 have identical collector currents since their base-emitter voltages are the same. Input transistor B5 has its collector coupled to resistor R4 and to the base of emitter-follower output transistor B3 whose emitter is coupled to a second constant current source I2. The differential voltages applied to the emitters of input transistors B5, B6 produce a large difference voltage at the base of output transistor B3. The emitter of output transistor B3 provides a single-ended output at terminal Z capable of delivering the required power to load L without the need for a coupling transformer and which operates in Class A without requiring excessive standby current.

The Thevenin equivalent circuit looking into terminals e, f of FIG. 1 is an ac generator having an open circuit peak-to-peak voltage of 650 millivolts and an internal resistance approximately equal to the sum of the values of resistors R30 and R 31, it is capable of delivering approximately 1 ma output at terminals e, f. This current is injected into the emitters of transistors B5, B6 of FIG. 2. When the ac signal applied to terminal f goes positive with respect to ground, it produces a corresponding increase in the base voltage of transistors B5 and B6. This occurs because diode-connected transistor B6 is maintained in conducting state by constant current source I1. The rise in base voltage of transistor B5 increases the current through its collector, increasing the voltage drop across collector resistor R4 at the base of emitter-follower output transistor B3, reducing the voltage drive to emitter-follower B3. At the same time that the ac signal at terminal f was assumed to be positive-going, the ac signal at terminal e is negative-going since the Gilbert mixer provides a differential signal. The negative-going ac signal at terminal e is applied to the emitter of transistor B5 increasing current through the collector emitter path of B5 and thereby further raising the voltage drop across resistor R4 and further decreasing the drive voltage to the base of emitter-follower output transistor B3. Since the input signals at terminals e, f are differential signals, whenever one of which is positive going the other of which is negative going, the process just described converts the small voltage swing differential input signal applied at terminals e, f to a large voltage swing across resistor R4 and, in the process, converts the differential input to a single-ended output, providing a large voltage drive to the single-ended output transistor B3. The ac voltage swing across resistor R4 is substantially equal to the ac input current applied at terminals e, f, multiplied by the current gain of B5, multiplied by the value of resistor R4.

In the illustrative embodiment the components had the following properties:

| Item | Value |
| --- | --- |
| Vcc | 2.7 volts |
| C1, C2 | 3 pF |
| R4 | 500Ω |
| R5, R6 | 200Ω |
| R15, R16 | 150Ω |
| R19, R20 | 222Ω |
| R30, R31 | 325Ω |
| L | 125Ω |

What has been described is deemed to be illustrative of the principles of the invention. It should be apparent that whilst, in the illustrative and preferred embodiment, constant current sources have been shown at I1 and I2, either or both thereof may be replaced by resistances of suitable size and, further, that the signal on terminal f is shown as being applied via capacitor C1 to the emitter of diode-connected transistor B6, it is also possible with somewhat different results, to connect the signal through capacitor C1 to the collector of transistor B6. Also, unipolar transistors may be substituted for bipolar transistors in which case the term emitter will be replaced by the term source, the term base will be replaced by the term gate, and the term collector replaced by the term drain in the foregoing description. Numerous other modifications may be made by those skilled in the art without, however, departing from the spirit and scope of the invention.

What is claimed is:

1. An RF amplifier for driving a single ended load impedance from a differential ac input signal whose peak-to-peak excursion does not exceed a small fraction of the battery voltage without the use of a coupling transformer, comprising, a pair of input transistors having their bases interconnected;

means for coupling said differential-input signal to the emitters of said input transistors, a first current source;

means connecting the first of said input transistors in circuit with said first current source so that said differential input signal effecting a change in said base voltage alters conduction in the second of said input transistors;

a second current source;

an emitter-follower output transistor having its emitter coupled to said load;

means connecting the collector of the second of said input transistors to the base of said emitter-follower output transistor; and means connecting the emitter of said emitter-follower output transistor to said second current source.

2. An RF amplifier according to claim 1, wherein said current sources are constant current sources.

3. An RF amplifier according to claim 1 wherein said current sources are resistances supplied by said source of battery voltage.

4. An RF amplifier according to claim 1, wherein said first of said transistors is diode connected.

5. A transceiver including an RF amplifier, comprising:

a pair of input transistors each having a base, a collector and an emitter, the bases being coupled to each other and the emitters being adapted to couple a differential input signal to the input transistors;

a first current source connected to the collector of a first of said transistors so that said differential input signal effecting a change in said base voltage alters conduction in the second of said input transistors;

a second current source; and an output transistor having an emitter adapted to be coupled to the second current source and a load, and a base coupled to a collector of the second of said input transistors.

6. A transceiver as recited in claim 5, wherein said first and said second current sources are constant current sources.

7. A transceiver as recited in claim 5, wherein the output transistor is configured as an emnitter-follower transistor.

8. An integrated circuit including an RF amplifier, comprising:

a pair of input semiconductor devices, having their control electrodes coupled to each other; a respective resistor connected to a corresponding electrode of each of said devices; means for applying a differential input signal between the junction of each said resistor and its respective electrode of said device;

a first current source connected to a second electrode of a first of said devices to effect a change in the base voltage of said input transistors in accordance with said differential input signal a second current source; and an output transistor having an emitter adapted to be coupled to the second current source and a load, and a base coupled to a second electrode of the second of said input devices.

9. In combination with a circuit which provides a differential output signal from a stacked transistor array supplied by a battery whose voltage exceeds the sum of the base-emitter voltages of said array by a few hundred millivolts, an RF amplifier for driving a single-ended load, comprising:

a pair of input transistors having their bases coupled together;

a first of said input transistors being diode-connected in series with a first constant current source supplied by said battery;

a second of said transistors including a respective collector resistor supplied by said battery;

means for coupling said differential output signal from said array to said transistors; and an emitter-follower transistor supplied by said battery having its emitter coupled to said load and its base coupled to the collector of said second transistor.

10. The combination of claim 9, wherein said means for coupling said differential output signal to said input transistors includes means for coupling one half of said differential output signal to the emitter of at least one of said input transistors.

11. The combination of claim 9, wherein said means for coupling said differential output signal to said input transistors includes capacitor means coupled to at least one of said emitters.

12. The combination of claim 9, wherein said emitter-follower is in circuit with a second constant current source.

13. The combination of claim 9, wherein said base of said emitter-follower transistor is coupled to the junction of said collector of said second transistor and its collector resistor.

14. The combination of claim 9 wherein circuit for providing said differential output signal is a Gilbert mixer or multiplier circuit and wherein said means for coupling said differential signal to said emitters is a respective capacitor in series between said Gilbert circuit and a respective emitter of said pair of common-base configured transistors.

15. The combination of claim 9 wherein said diode-connected transistor and said second transistor form a current-mirror connection.

16. A method of driving a single-ended load from a Gilbert multiplier supplied by a low-voltage battery, said multiplier providing a differential RF voltage whose peak-to-peak value is a small fraction of said voltage, comprising:

applying said differential RF voltage to the emitters of a pair of common-base configured transistors adapted to be powered by a battery to effect corresponding changes in their base voltage, said pair of transistors being configured as a dc current mirror wherein a first of said transistors establishes the dc current through the second of said transistors; and coupling the collector voltage of said second of said transistors to the base of an emitter-follower transistor adapted to be powered by said low-voltage battery to drive said load.

17. A method of driving a single-ended load from a Gilbert multiplier according to claim 16 wherein said transistors are unipolar.

* * * * *